United States Patent
Fang et al.

(10) Patent No.: US 7,172,948 B2
(45) Date of Patent: Feb. 6, 2007

(54) METHOD TO AVOID A LASER MARKED AREA STEP HEIGHT

(75) Inventors: Chin-Kun Fang, Tainan (TW); Kun-Pi Cheng, Tainan (TW); Wei-Jen Wu, Tainan (TW); Ching-Jiunn Huang, Changhua (TW); Chung-Jen Chen, Tainan (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 54 days.

(21) Appl. No.: 10/761,657

(22) Filed: Jan. 20, 2004

(65) Prior Publication Data

US 2005/0158966 A1    Jul. 21, 2005

(51) Int. Cl.
*H01L 21/76* (2006.01)
(52) U.S. Cl. .................. 438/401; 438/427; 438/975; 257/797; 257/E21.002
(58) Field of Classification Search ............ 438/401, 438/427, 975; 257/797
See application file for complete search history.

(56) References Cited

U.S. PATENT DOCUMENTS

| | | | | |
|---|---|---|---|---|
| 5,911,110 A | * | 6/1999 | Yu | 438/424 |
| 6,215,197 B1 | * | 4/2001 | Iwamatsu | 257/797 |
| 6,603,162 B1 | * | 8/2003 | Uchiyama et al. | 257/296 |
| 6,667,221 B2 | * | 12/2003 | Kitazawa et al. | 438/401 |
| 6,790,742 B2 | * | 9/2004 | Yang et al. | 438/401 |
| 6,803,291 B1 | * | 10/2004 | Fu et al. | 438/401 |

* cited by examiner

*Primary Examiner*—Zandra V. Smith
*Assistant Examiner*—Christy Novacek
(74) *Attorney, Agent, or Firm*—Tung & Associates

(57) ABSTRACT

A semiconductor process wafer having substantially co-planar active areas and a laser marked area in an adjacent inactive area and method for forming the same to eliminate a step height and improve a subsequent patterning process over the active areas wherein an inactive area trench is formed overlying the laser marked area in parallel with formation of STI trenches in the active area whereby the active areas and the inactive area are formed substantially co-planar without a step height.

26 Claims, 4 Drawing Sheets

METHOD TO AVOID A LASER MARKED AREA STEP HEIGHT

FIELD OF THE INVENTION

This invention generally relates to semiconductor processing methods including photolithographic patterning and more particularly to a method for forming laser marked areas to avoid a defocusing step height with respect to adjacent active areas of a process wafer in addition to reducing accumulation of CMP residue over the laser mark area to improve subsequent manufacturing processes.

BACKGROUND OF THE INVENTION

As device critical dimensions shrink to lower than deep submicron (less than 0.25 micron), the efficient use of wafer process area becomes critical. The practice in the industry has been to add a laser mark consisting of an alphanumeric, barcode, or other type of identification mark on the front of process side of the wafer to characterize e.g., the wafer manufacturer, conductivity type, resistivity, flatness, wafer number, and device type. Automatic code readers can track the process wafers at various stages of the process and provide information on wafer movement in the fabrication process. The wafer laser mark is typically located at the wafer periphery in an exclusion zone that is within about 2 to about 3 mm from the wafer peripheral edge.

In a typical integrated circuit manufacturing process, photolithographically formed patterns and etched features are formed across the entire wafer, including the exclusion zone to reduce subsequent CMP preferential polishing in unpatterned areas, also referred to as a CMP loading effect.

According to prior art processes, in order to avoid covering up the laser mark at the wafer periphery, the practice has been to remove resist overlying the laser mark area to allow the material above the laser mark to be cleared out in a subsequent etching process.

A problem with prior art approaches is that by removing material over the laser mark area an undesirable step height is formed between the process surface and the laser mark area resulting in loss of resolution of neighboring formed feature patterns in lithographic processes due the phenomenon of defocus. The rejection of neighboring die areas is costly to yield. Further, the recessed area in the wafer process surface created by the cleared out laser mark area will act as a trap for collecting metal residue, for example copper, in subsequent integrated circuit manufacturing processes, increasing the possibility of wafer contamination including cross-process particle contamination.

Therefore, there is a need in the semiconductor processing art to develop an improved method for preserving process wafer laser markings while avoiding detrimental effects including loss of pattern resolution in neighboring active die areas.

It is therefore among the objects of the present invention to provide an improved method for preserving process wafer laser markings while avoiding detrimental effects including loss of pattern resolution in neighboring active die areas, while overcoming other shortcomings of the prior art.

SUMMARY OF THE INVENTION

To achieve the foregoing and other objects, and in accordance with the purposes of the present invention, as embodied and broadly described herein, the present invention provides a method for avoiding a step height over a readable laser marked portion of a process wafer to improve a subsequent patterning process of adjacent active areas.

In a first embodiment, the method includes providing a process wafer comprising active area trenches and at least one inactive area trench formed overlying at least a portion of a laser marked portion; forming a filling layer over the active area trenches and the at least one inactive area trench to substantially fill the respective trenches; forming a resist layer comprising patterned portions disposed between the active area trenches and the at least one inactive area trench; removing the filling layer portions not covered by the resist layer; removing the resist layer; and, planarizing the wafer process surface wherein the active area trenches and the at least one inactive area trench are substantially co-planar.

These and other embodiments, aspects and features of the invention will be better understood from a detailed description of the preferred embodiments of the invention which are further described below in conjunction with the accompanying Figures.

DETAILED DESCRIPTION OF THE PREFERRED EMBODIMENTS

Although the method of the present invention is explained in exemplary implementation with respect to an STI formation process, it will be appreciated that the method of leaving resist covering a laser mark area, while forming a dummy pattern between an active device area and a laser mark area prior to an etching process to improve a subsequent CMP process may be used to avoid a step height in other device formation processes, for example to prevent a step height over an alignment mark area. The term 'active area' as used herein refers to areas of the semiconductor process surface where electrically active areas are formed as integrated circuit components of a semiconductor device, for example including one or more die areas of the wafer.

Figure 1A:
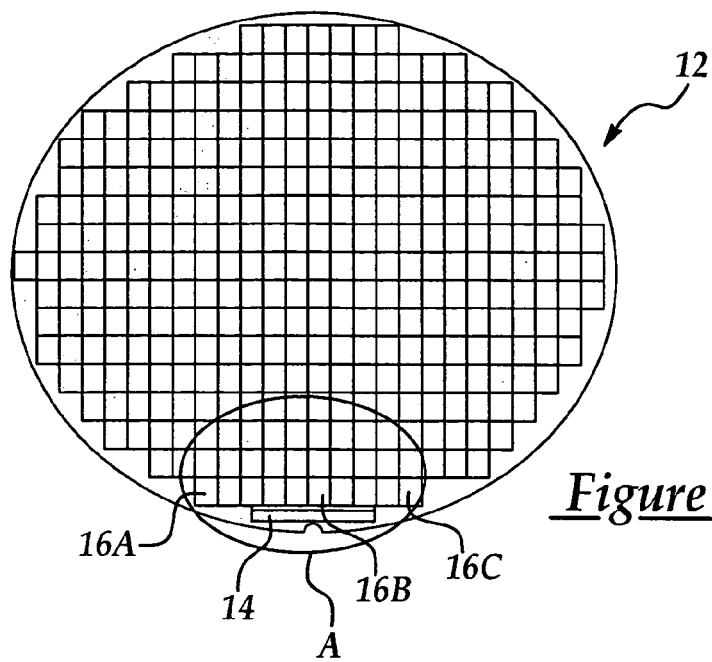
FIG. 1A is a top planar view of an exemplary semiconductor wafer laser marked area adjacent active area die according to an embodiment of the present invention.

For example, referring to FIG. 1A is shown a top planar view an exemplary semiconductor process wafer 12 having a laser mark area, e.g., 14 located at a periphery of the process wafer, for example an exclusion zone or inactive area of the wafer and having adjacent active area dice, e.g., 16A, 16B, and 16C. The laser mark area 14 may be any conventional laser mark area, where a process wafer information is added by conventional methods of laser marking in the exclusion zone during a wafer preparation process, for example in an area between about 2 mm and about 4 mm from the wafer peripheral edge. The wafer laser markings include, for example, alphanumeric, barcode, or other type of identification marks on the process side of the wafer to characterize e.g., the wafer manufacturer, conductivity type, resistivity, flatness, wafer number, and device type.

It has been found according to the present invention that a lithographic patterning process carried out over active areas adjacent the laser mark area 14, e.g., an active area encompassed by circle A, is improved by eliminating a step height over the laser mark area in an STI formation process according to an embodiment of the invention. For example it has been found that active areas adjacent the laser mark area 14 including several die portions of the wafer, e.g., those die within circle portion A, suffer from a defocusing effect in a photolithographic process due to a laser mark step height according to prior art processes. The present invention, by eliminating the step height over the laser mark area 14, solves the defocusing problem and improves lithographic patterning resolution for die adjacent the laser mark area, e.g., within circled wafer portion A.

Figure 1B:
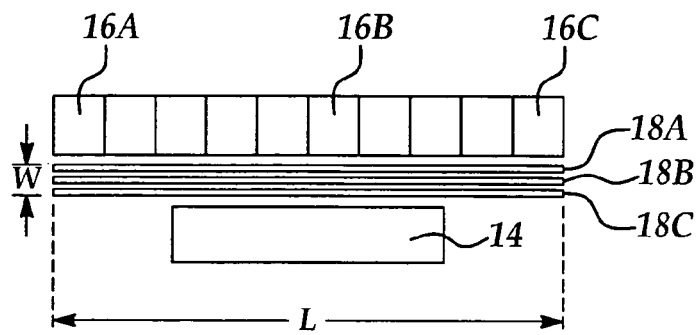
FIG. 1B is an expanded top planar view of an exemplary semiconductor wafer laser mark area including a dummy pattern according to an embodiment of the present invention.

For example, referring to FIG. 1B, is shown a top planar view of an expanded portion of the exemplary laser mark area 14 including an adjacent active area e.g., die portions 16A, 16B, and 16C. In an exemplary embodiment of the present invention as explained in greater detail in FIG. 2A–2F, a dummy pattern e.g., lines 18A, 18B, and 18C are formed between the active device areas, e.g., 16A, 16B, and 16C, and the laser mark area 14, prior to a CMP process to form backfilled shallow trench isolation (STI) structures. Preferably, the dummy pattern is formed at least adjacent the full length L of the active device areas of the process wafer. In addition, the width W, of the dummy pattern is greater than about 1.5 mm, which may include one or more lines, preferably two or more lines, preferably about evenly spaced, For example, the individual linewidths e.g., 18A, 18B, and 18C of the dummy pattern may be formed with a linewidth of from about 1 micron to about 500 microns and with a pitch (spacing between lines) a factor of about 1 to about 4 times the linewidth. It will be appreciated that the linewidths and overall width, W of the dummy pattern may be varied depending on the area between the active device area e.g., 16A, 16B, and 16C and the laser mark area 14.

Figure 2A:
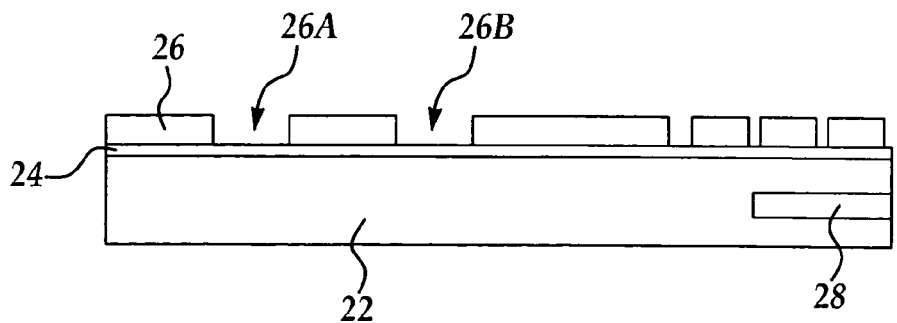
FIGS. 2A–2H are cross-sectional views of a portion of a process wafer at stages in manufacture of STI structures according to an embodiment of the present invention.

Referring to FIG. 2A, is shown an exemplary process wafer cross sectional view according to in an exemplary implementation of the method of the present invention. Shown is a silicon wafer substrate 22, preferably having a thermally grown pad oxide (e.g., $SiO_2$) overlayer (not shown) and an overlying nitride layer, preferably a silicon nitride (e.g., $Si_3N_4$) and/or silicon oxynitride (e.g., SiON) hardmask layer 24 formed by conventional processes, e.g., LPCDV or PECVD to conventional thicknesses, for example from about 500 Angstroms to about 2000 Angstroms.

Still referring to FIG. 2A, a resist layer e.g., 26 is deposited and patterned according to conventional process to form an etching pattern e.g., openings 26A and 26B for forming STI trenches (active area trenches) in the silicon substrate 22 and including an arbitrary pattern at the wafer periphery overlying a wafer laser marked area 28, generally represented in cross section by an enclosed box.

Figure 2B:
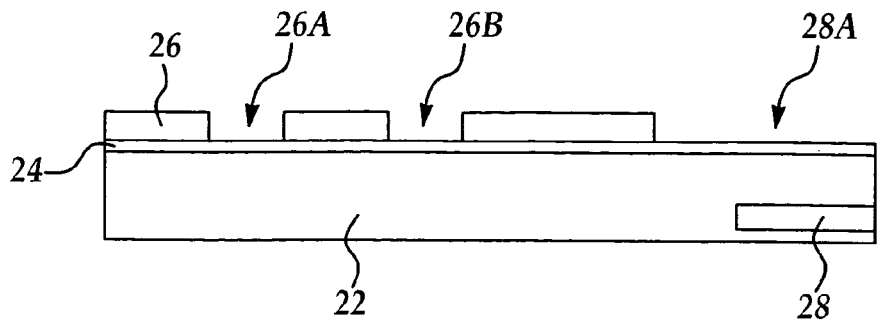
Figure 2C:
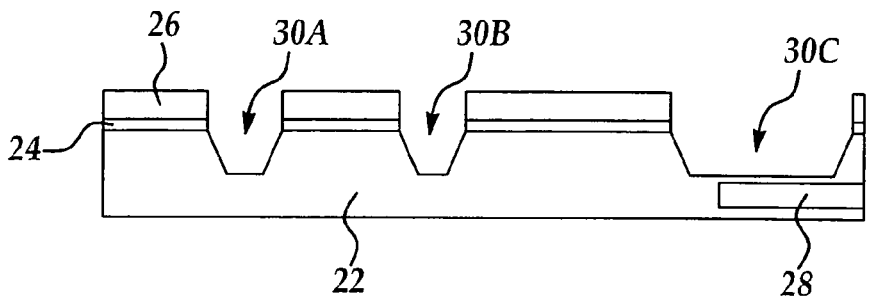

Referring to FIG. 2B, a conventional localized (edge removal) stripping process is used to remove the resist layer 26 portions overlying the wafer peripheral exclusion area (inactive area) e.g., 28A including overlying the laser mark area 28 for forming a trench (inactive area trench). Referring to FIG. 2C, a conventional plasma enhanced etch process is then carried out to first etch through the overlying nitride hard mask layer 24, followed by a conventional plasma enhanced silicon etching process to form STI trenches e.g., 30A, 30B in the active device region in the silicon substrate 22 as well as a trench e.g., 30C overlying the laser mark area 28. The STI trenches are formed to conventional depths and widths, for example, having sidewall angles between about 70 and about 85 degrees.

Figure 2D:
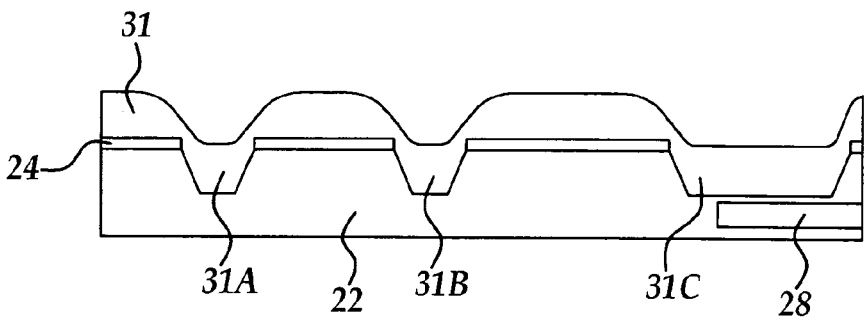

Referring to FIG. 2D, following optionally thermally growing an oxide liner (not shown) within the STI trenches, the trenches are backfilled with $SiO_2$, also referred to as an STI oxide by a conventional blanket deposition process, e.g., HDP-CVD or PECVD, preferably HDP-CVD. It will be appreciated that the surface topography following the blanket deposition process is schematically represented in the Figures. For example, STI oxide layer 31 is shown as nonplanar process surface topography following the blanket deposition process. Preferably the STI oxide layer is backfilled to about equal to or higher than the nitride hardmask layer 24 to produce backfilled trenches e.g., 31A, 31B, and 31C.

Figure 2E:
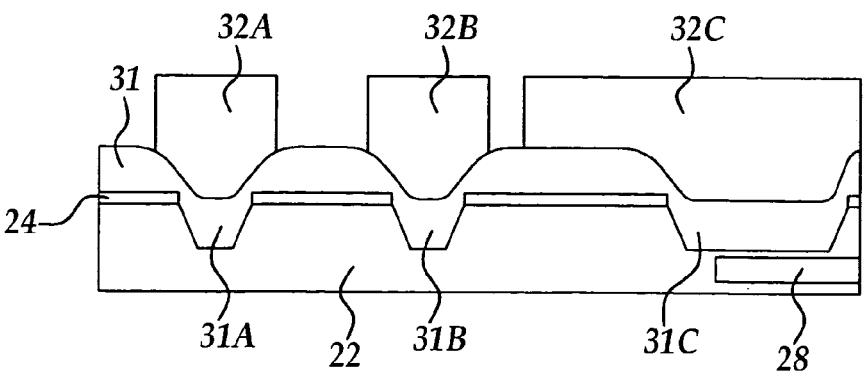

Referring to FIG. 2E, in an aspect of the present invention, a reverse mask etch process, also referred to as a reverse tone patterning process is carried out to form a patterned photoresist layer over the STI oxide layer 31, leaving resist layer portions e.g., 32A and 32B overlying the STI trenches in the active device area of the wafer. In an important aspect of the invention an undeveloped resist layer portion e.g., 32C is left overlying a portion of an inactive area at the wafer periphery. The inactive area covered by the resist portion e.g., 32C preferably includes an area adjacent to the active area including STI trenches e.g., 31A, and 31B disposed between the laser mark area of the wafer and the STI trenches including overlying the laser mark area 28, e.g., extending up to about the wafer peripheral edge (not shown).

Figure 2F:
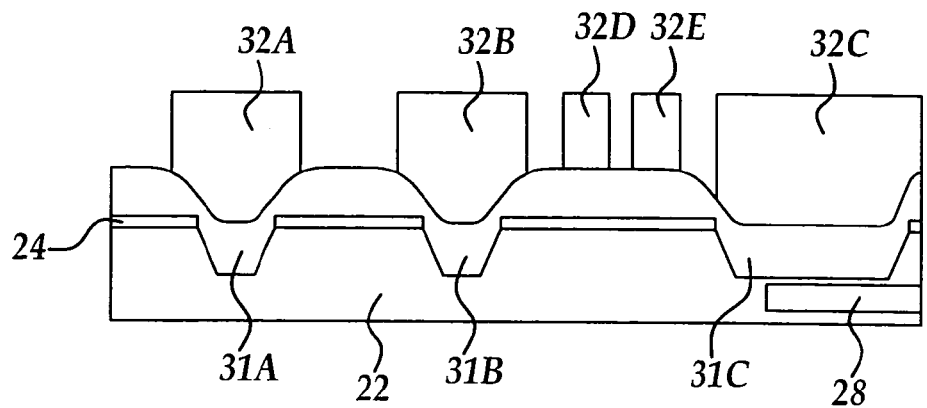

Referring to FIG. 2F, in another aspect of the invention, following the reverse tone patterning process including development of the resist, a dummy pattern is added to unpatterned resist portion e.g., 32C between the active area including STI trench 31B and the inactive area trench 31C overlying the laser mark area 28. For example, following the reverse tone patterning process, an additional dummy pattern mask, according to preferred embodiments, is interposed between the reverse tone pattern mask and the process wafer surface to allow proper re-alignment of the reticle (mask) over the desired wafer exposure area, e.g., a one shot exposure of resist portion 32C, while avoiding shadowing (shielding) effects from the reverse tone pattern mask during exposure. Following exposure and development of the resist layer portion 32C, dummy pattern resist portions e.g., 32D and 32E are formed in the resist layer as shown in an exemplary embodiment, while leaving a portion of resist layer portion e.g., 32C overlying the trench 31C, which at least partially, preferably substantially completely, overlies the laser mark area 28.

Figure 2G:
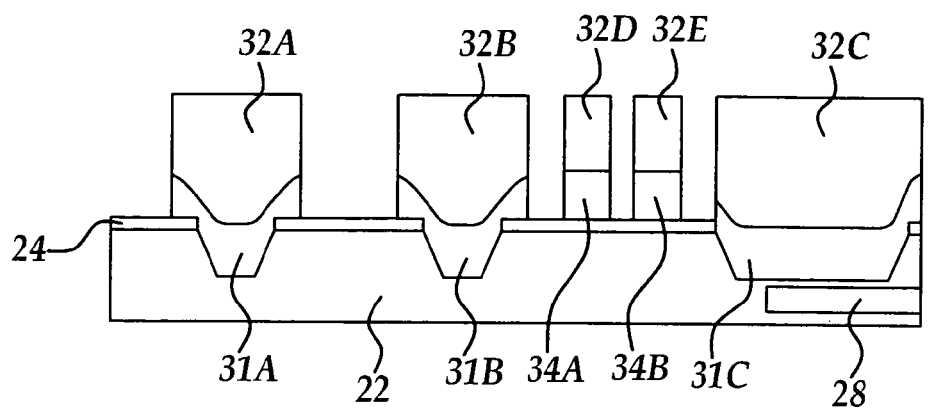

Referring to FIG. 2G, a conventional STI oxide dry etching process is then carried to etch through the STI oxide layer thickness according to the patterned resist portions and expose the hard mask layer 24. Following removal of the reverse tone patterning resist layer portions by a conventional resist removal process, unetched portions of the STI oxide layer, e.g., underlying resist pattern portions 32D and 32E, e.g., 34A and 34B, respectively remain as a dummy pattern. Advantageously the dummy pattern portions of the STI oxide layer e.g., 34A, 34B, act to prevent CMP loading, or preferential polishing of both the active area and adjacent inactive area in a subsequent CMP process.

Figure 2H:
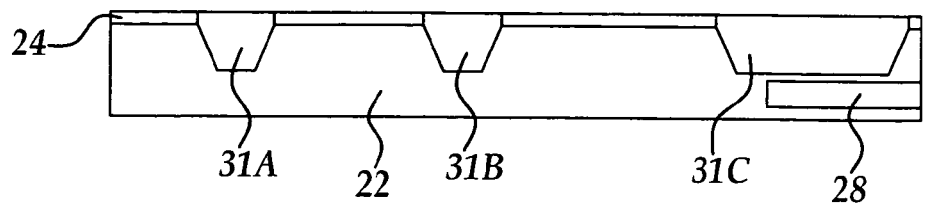

Referring to FIG. 2H, following removal of the resist layer portions, a conventional STI oxide CMP process is then carried out to remove remaining portions of the STI oxide layer, stopping on the hardmask layer 24. Advantageously, the filled trench 31C overlying the laser mark area prevents collection of CMP residue and advantageously eliminates a step height in subsequent photolithographic patterning processes, thereby avoiding a defocusing effect to improve a resolution of subsequently patterned features in adjacent active areas e.g., between STI trenches 31A and 31B. It will be appreciated that the STI oxide overlying the laser mark area may optionally be removed in a subsequent process.

Figure 3:
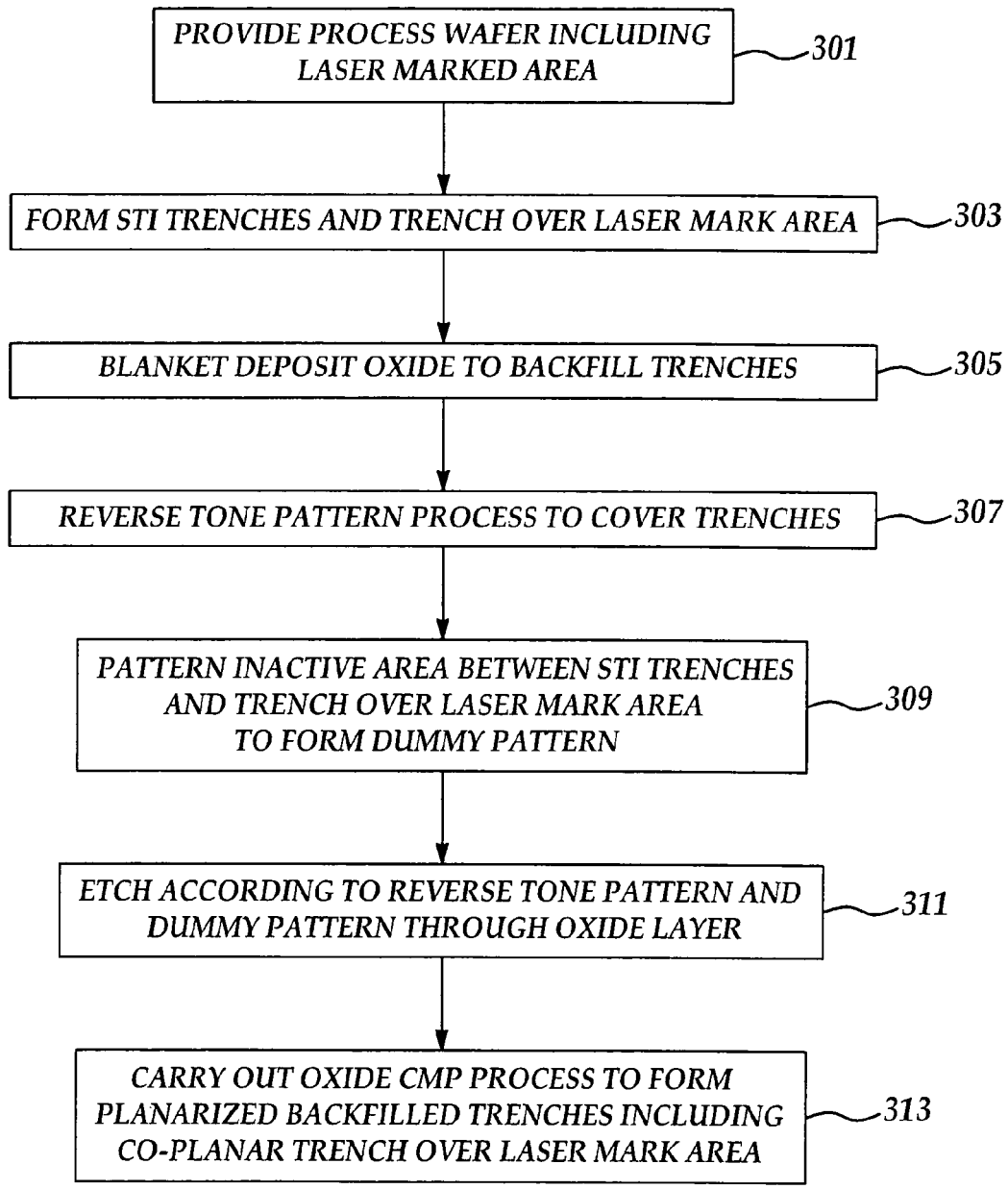
FIG. 3 is a process flow diagram including several embodiments of the present invention.

Referring to FIG. 3 is an exemplary process flow diagram including several embodiments of the present invention. In process 301, a semiconductor process wafer including a laser mark area is provided including an uppermost hardmask layer overlying active areas and laser mark areas. In process 303 an STI trench photolithographic patterning process is carried out including exposing an area overlying the laser mark followed by an etching process to form STI trenches including a trench overlying the laser mark area (laser mark trench). In process 305, an STI oxide layer is deposited to backfill the STI trenches and laser mark trench. In process 307, a reverse tone patterning process is carried out to form reverse tone pattern resist portions overlying the STI trenches and an inactive area including the laser mark area. In process 309, a second patterning process is carried out to form a dummy pattern in the inactive area portion disposed between the active area STI trenches and the laser mark area according to preferred embodiments. In process 311, a dry etching process is carried out to etch through the STI oxide layer thickness to expose portions of the hard mask layer. In process 313, an STI oxide CMP process is carried out to remove residual STI oxide portions to planarize the wafer process surface including form a substantially co-planar laser mark area to eliminate a step height.

The preferred embodiments, aspects, and features of the invention having been described, it will be apparent to those skilled in the art that numerous variations, modifications, and substitutions may be made without departing from the spirit of the invention as disclosed and further claimed below.

What is claimed is:

1. A method for avoiding a step height over a readable laser marked portion of a process wafer comprising the steps of:
   providing a process wafer comprising active area trenches and at least one inactive area trench formed overlying at least a portion of a laser marked portion at the process wafer periphery;
   forming a filling layer over the active area trenches and the at least one inactive area trench to substantially fill the respective trenches;
   forming a resist layer comprising first patterned portions and second patterned portions, said first patterned portions overlying the active area trenches and second patterned portions disposed between the active area trenches and the at least one inactive area trenches, said first and second patterned portions formed separately from one another;
   removing the filling layer portions not covered by the resist layer;
   removing the resist layer to expose remaining filling layer portions; and,
   planarizing the wafer process surface including removing said remaining filling layer portions according to chemical mechanical polish (CMP) process wherein the active area trenches and the at least one inactive area trench including said laser marked portion are substantially co-planar.

2. The method of claim 1, wherein the step of removing the filling layer portions comprises a dry etching process.

3. The method of claim 1, wherein the laser marked portion comprises an exclusion area at the process wafer periphery adjacent the process wafer peripheral edge.

4. The method of claim 1, wherein the active area trenches comprise shallow trench isolation (STI) trenches.

5. The method of claim 1 wherein the process wafer comprises a silicon substrate and at least one overlying nitride layer.

6. The method of claim 1, wherein the filling layer is selected from the group consisting of silicon dioxide and silicon oxynitride.

7. The method of claim 1, wherein the patterned portions comprise a linear shape extending adjacent the length of the active area trenches.

8. The method of claim 1, wherein the patterned portions comprise a width of greater than about 1.5 mm.

9. The method of claim 8, wherein the patterned portions comprise at least two lines having a linewidth of from about 10 microns to about 500 microns with a pitch from about 1 to about 4 times the linewidth.

10. A method for eliminating a step height over a readable laser marked portion of a process wafer to improve a subsequent patterning process over adjacent active areas comprising the steps of:
    providing a process wafer comprising an active area including shallow trench isolation (STI) trenches and at least one trench formed in an adjacently disposed inactive area overlying a laser marked portion of the process wafer comprising readable information;
    blanket depositing a layer of filling material over the process wafer surface;
    forming a resist layer over comprising first patterned portions overlying the active area and an unpatterned portion overlying the inactive area;
    lithographically patterning the resist layer to form second patterned portions disposed between the active area and the inactive area, said lithographically patterning comprising inserting a second mask comprising an image of the second patterned portions between the process wafer surface and a first mask comprising an image of the first patterned portions;
    carrying out an etching process to etch through a thickness of exposed portions of the filling material according to the first and second patterned portions;
    removing the resist layer; and
    carrying out a CMP process to planarize the wafer process surface including the active area and the inactive area without an intervening step height.

11. The method of claim 10, wherein the laser marked portion comprises an exclusion area at the process wafer periphery.

12. The method of claim 10, wherein the process wafer comprises a silicon substrate and at least one overlying nitride layer.

13. The method of claim 10, wherein the filling material is selected from the group consisting of silicon oxide and silicon oxynitride.

14. The method of claim 10, wherein the first patterned portions comprise a reverse tone pattern.

15. The method of claim 10, wherein the second patterned portions comprise lines extending adjacent the length of the active area.

16. The method of claim 10, wherein the second patterned portions comprise a width of greater than about 1.5 mm.

17. The method of claim 10, wherein the second patterned portions comprise at least two lines having a linewidth of from about 10 microns to about 500 microns with a pitch from about 1 to about 4 times the linewidth.

18. The method of claim 10, wherein the readable information is selected from the group consisting of alphanumeric characters, numbers, and bar codes.

19. A method for avoiding a step height over a readable laser marked portion of a process wafer comprising the steps of:
providing a process wafer comprising active area trenches and at least one inactive area trench formed overlying at least a portion of a laser marked portion;
forming a filling layer over the active area trenches and the at least one inactive area trench to substantially fill the respective trenches;
forming a resist layer comprising first patterned portions according to a first mask, said first patterned portions disposed between the active area trenches and the at least one inactive area trench;
then patterning the resist layer to form second patterned portions according to a second mask, said second patterned portions disposed between the active area and the inactive area;
removing the filling layer portions not covered by the resist layer;
removing the resist layer; and,
planarizing the wafer process surface wherein the active area trenches and the at least one inactive area trench are substantially co-planar.

20. The method of claim 19, wherein the planarization process comprises a chemical mechanical polish (CMP) process.

21. The method of claim 19, wherein the step of removing the filling layer portions comprises a dry etching process.

22. The method of claim 19, wherein the linear first patterned portions comprise a linear shape extending adjacent the length of the active area trenches.

23. A method for avoiding a step height over a readable laser marked portion of a process wafer comprising the steps of:
providing a process wafer comprising active area trenches and at least one inactive area trench formed overlying at least a portion of a laser marked portion;
forming a filling layer over the active area trenches and the at least one inactive area trench to substantially fill the respective trenches;
forming a resist layer comprising first patterned portions overlying the active area, an unpatterned portion overlying the inactive area, and a second patterned portion between the active area trenches and the at least one inactive area trench, said first and second patterned portions formed separately according to a first and a second mask;
removing the filling layer portions not covered by the resist layer;
removing the resist layer; and,
planarizing the wafer process surface wherein the active area trenches and the at least one inactive area trench are substantially co-planar.

24. The method of claim 23, wherein the planarization process comprises a chemical mechanical polish (CMP) process.

25. The method of claim 23, wherein the step of removing the filling layer portions comprises a dry etching process.

26. The method of claim 23, wherein the second patterned portion comprises a linear shape extending adjacent the length of the active area trenches.

* * * * *